US012453259B2

(12) United States Patent
Sano

(10) Patent No.: US 12,453,259 B2
(45) Date of Patent: Oct. 21, 2025

(54) ELECTRONIC DEVICE WITH SHAPE MEMORY RESIN

(71) Applicant: Magnolia White Corporation, Tokyo (JP)

(72) Inventor: Takumi Sano, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 570 days.

(21) Appl. No.: 17/897,562

(22) Filed: Aug. 29, 2022

(65) Prior Publication Data

US 2022/0416182 A1 Dec. 29, 2022

Related U.S. Application Data

(63) Continuation of application No. PCT/JP2020/047437, filed on Dec. 18, 2020.

(30) Foreign Application Priority Data

Mar. 2, 2020 (JP) .................................. 2020-034821

(51) Int. Cl.
*H10K 59/131* (2023.01)
*H10K 50/844* (2023.01)
*H10K 77/10* (2023.01)

(52) U.S. Cl.
CPC ......... *H10K 59/131* (2023.02); *H10K 50/844* (2023.02); *H10K 77/111* (2023.02)

(58) Field of Classification Search
CPC ... H10K 59/131; H10K 77/111; H10K 50/844
See application file for complete search history.

(56) References Cited

U.S. PATENT DOCUMENTS

2007/0188986 A1* 8/2007 Kobayashi .............. G09F 13/22
361/679.21
2015/0282294 A1 10/2015 Wakuda et al.
(Continued)

FOREIGN PATENT DOCUMENTS

JP  2007-134473 A  5/2007
JP  2015-198101 A  11/2015
(Continued)

OTHER PUBLICATIONS

English translation of Office Action issued in related Japanese Patent Application No. 2020-034821 mailed on May 7, 2024. 4 pages.
(Continued)

*Primary Examiner* — Lex H Malsawma
(74) *Attorney, Agent, or Firm* — K&L Gates LLP

(57) ABSTRACT

According to one embodiment, an electronic device, wherein a insulating base and a wiring line are located between a first resin layer and a second resin layer, the insulating base includes a plurality of line portions in which the wiring line is located, and a plurality of island-shaped portions connected to the plurality of line portions, the second resin layer includes a first portion overlapping the plurality of line portions and the plurality of island-shaped portions, and a second portion located between the plurality of line portions, the second portion is in contact with the first resin layer, and at least one of the first resin layer, the first portion and the second portion is a shape memory resin layer.

4 Claims, 10 Drawing Sheets

(56) References Cited

U.S. PATENT DOCUMENTS

| | | | |
|---|---|---|---|
| 2015/0282296 | A1 | 10/2015 | Ogura et al. |
| 2017/0181276 | A1 | 6/2017 | Sawada et al. |
| 2017/0181277 | A1* | 6/2017 | Tomita .................. H05K 1/038 |
| 2019/0386229 | A1 | 12/2019 | Li |
| 2021/0013431 | A1 | 1/2021 | Kawata et al. |

FOREIGN PATENT DOCUMENTS

| | | |
|---|---|---|
| JP | 2015-198102 A | 11/2015 |
| JP | 2017-113088 A | 6/2017 |
| JP | 2017-118109 A | 6/2017 |
| JP | 2017-220559 A | 12/2017 |
| JP | 2019-175924 A | 10/2019 |

OTHER PUBLICATIONS

International Search Report issued in International Patent Application No. PCT/JP2020/047437 on Mar. 16, 2021 and English translation of same. 5 pages.

Written Opinion issued in International Patent Application No. PCT/JP2020/047437 on Mar. 16, 2021. 4 pages.

\* cited by examiner

ELECTRONIC DEVICE WITH SHAPE MEMORY RESIN

CROSS-REFERENCE TO RELATED APPLICATIONS

This application is a Continuation Application of PCT Application No. PCT/JP2020/047437, filed Dec. 18, 2020 and based upon and claiming the benefit of priority from Japanese Patent Application No. 2020-034821, filed Mar. 2, 2020, the entire contents of all of which are incorporated herein by reference.

FIELD

Embodiments described herein relate generally to an electronic device.

BACKGROUND

In recent years, the use of flexible substrates with flexibility and elasticity has been discussed in various fields. To cite one example, such a use mode can be considered that a flexible substrate with electrical elements arrayed in a matrix is attached to a curved surface such as the housing of an electronic device or the human body. As the electrical elements, for example, various types of sensors such as touch sensors and temperature sensors, and display elements can be applied.

In flexible substrates, it is necessary to take measures to prevent wiring lines from being damaged by stress caused by bending and stretching. As such measures, for example, it has been proposed to provide honeycomb-shaped openings in the base material which supports the wiring lines or to make the wiring lines to meander (a meander shape).

DETAILED DESCRIPTION

Figure 1:
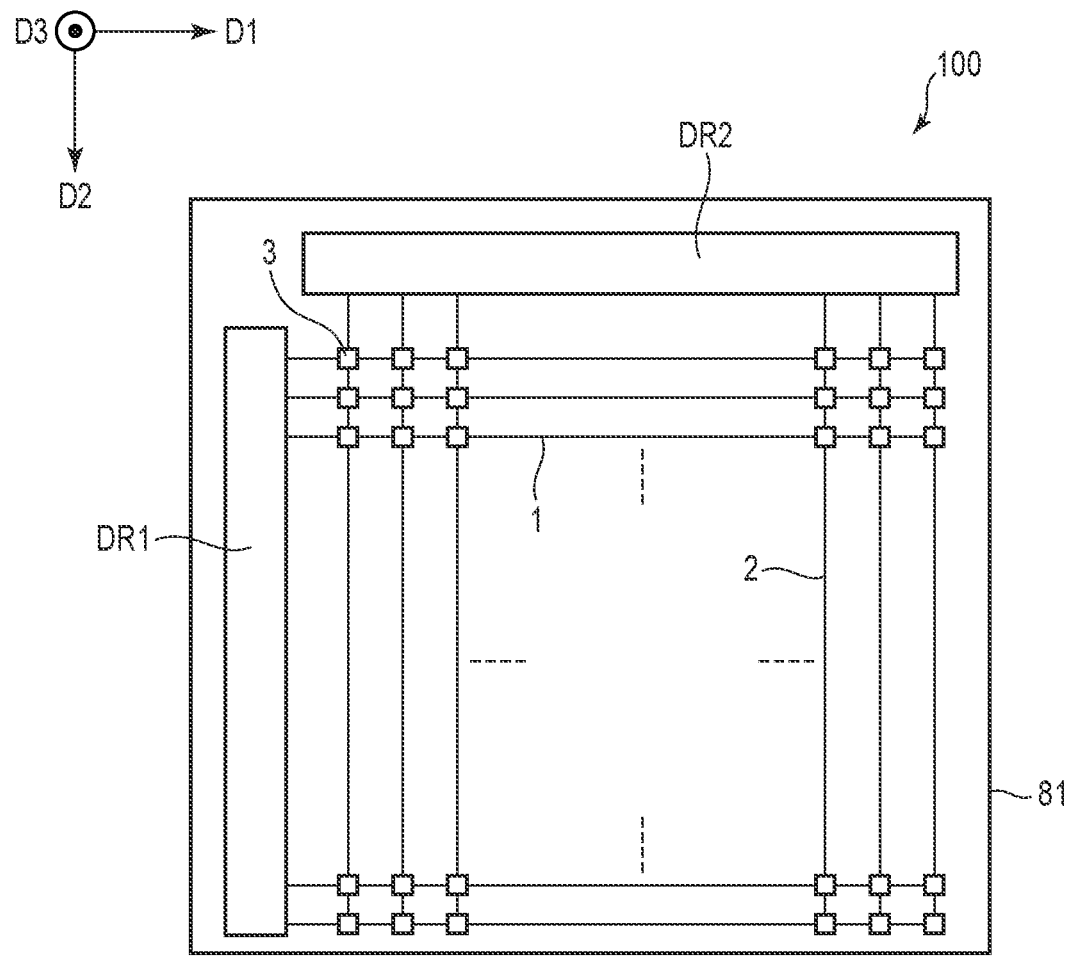
FIG. 1 is a plan view schematically showing a flexible substrate according to an embodiment.

In general, according to one embodiment, there is provided an electronic device comprising a first resin layer, a flexible insulating base disposed on the first resin layer, a wiring line disposed on the insulating base and a second resin layer covering the insulating base and the wiring line, and the flexible insulating base and the wiring line are located between the first resin layer and the second resin layer, the insulating base includes a plurality of line portions in which the wiring line is located, and a plurality of island-shaped portions connected to the plurality of line portions, the second resin layer including a first portion overlaps the plurality of line portions and the plurality of island-shaped portions and a second portion located between the plurality of line portions, the second portion is in contact with the first resin layer, and at least one of the first resin layer, the first portion and the second portion is a shape memory resin layer.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

In this embodiment, a flexible substrate 100 will be discussed as an example of the electronic device.

FIG. 1 is a plan view schematically showing the flexible substrate 100 according to this embodiment.

In this embodiment, a first direction D1, a second direction D2 and a third direction D3 are defined in the drawings. The first direction D1 and the second direction D2 are parallel to the main surface of the flexible substrate 10 and they intersect each other. The third direction D3 is perpendicular to the first direction D1 and the second direction D2 and equivalent to the thickness direction of the flexible substrate 100. The first direction D1 and the second direction D2 intersect perpendicularly in this embodiment, but they may intersect at an angle other than right angles. In this specification, the direction toward the tip of the arrow indicating the third direction D3 is referred to as "up" and the direction from the tip of the arrow to the opposite direction is referred to as "down". Further, when it is also assumed that there is an observation position for observing the flexible substrate 100 on the tip side of the arrow indicating the third direction D3, viewing from this observation position towards a D1-D2 plane defined by the first direction D1 and the second direction D2 is referred to as plan view.

The flexible substrate 100 comprises a plurality of scanning lines 1, a plurality of signal lines 2, a plurality of electrical elements 3, a first shape memory resin layer 81, a scanning line driver DR1 and a signal line driver DR2. The scanning lines 1, the signal lines 2, the electrical elements 3, the scanning line driver DR1 and the signal line driver DR2 are located on the first shape memory resin layer 81. The scanning lines 1 each extend along the first direction D1 and are aligned along the second direction D2. The scanning lines 1 are each connected to the scanning line driver DR1. The signal lines 2 each extend along the second direction D2 and are aligned in along the first direction D1. The signal lines 2 are each connected to the signal line driver DR2. The electrical elements 3 are each located at an intersection of the respective scanning line 1 and the respective signal line 2 and are electrically connected to the scanning line 1 and the signal line 2. The details of the functions of the electrical elements 3 will be described later.

Figure 2:
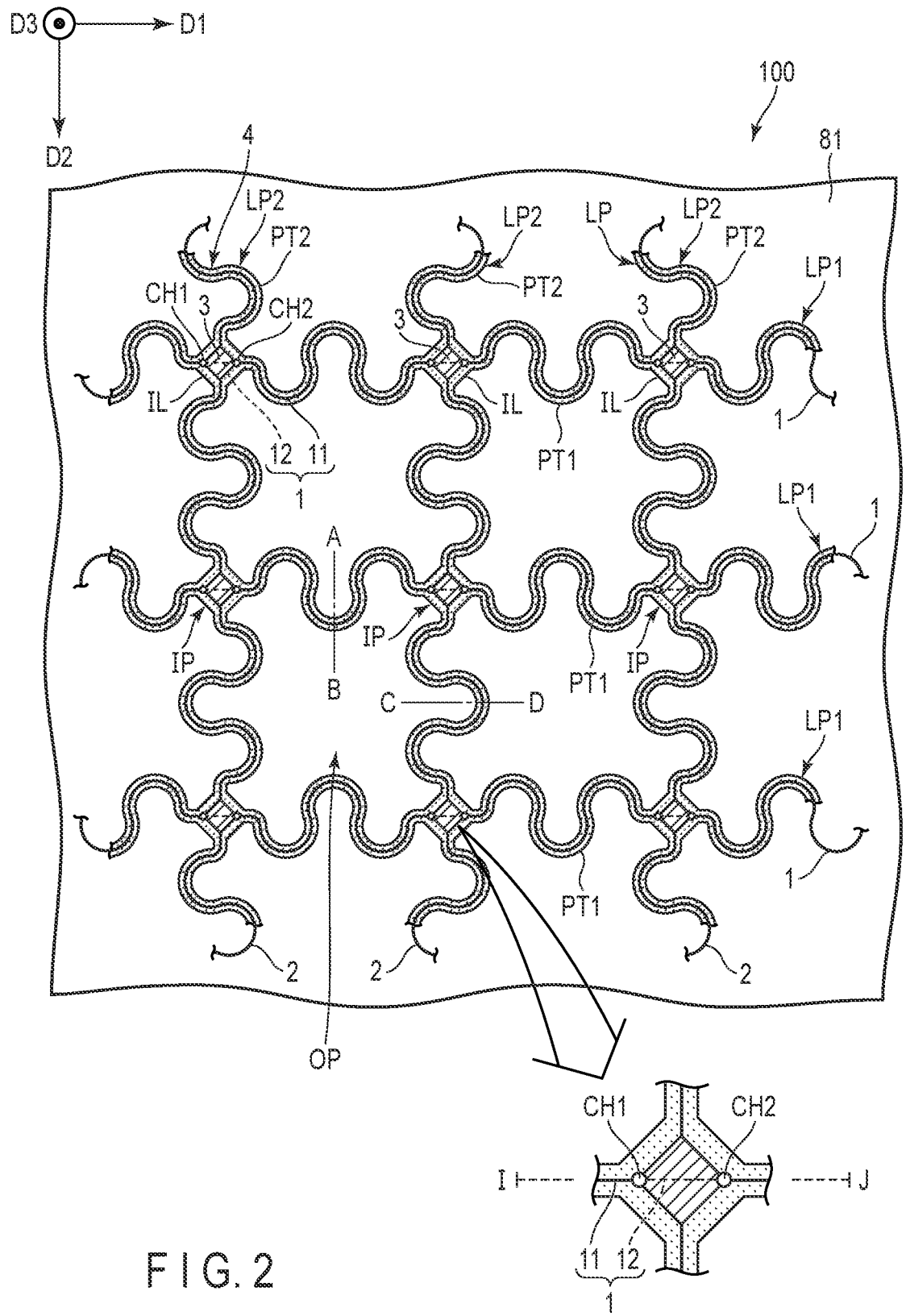
FIG. 2 is a partially enlarged plan view of the flexible substrate shown in FIG. 1.

FIG. 2 is a partial enlarged plan view of the flexible substrate 100 shown in FIG. 1.

The flexible substrate 100 comprises, in addition to those listed above, an insulating base 4 which supports the scanning lines 1 and the signal lines 2.

The insulating substrate 4 includes, in plan view, a plurality of first portions (line portions) PT1 extending along the first direction D1 and aligned along the second direction D2, a plurality of second portions (line portions) PT2 extending along the second direction D2 and aligned along the first direction D1 and a plurality of island-shaped portions IL each provided at an intersection of the respective first portion PT1 and the respective second portion PT2. In plan view, the first portions PT1 and the second portions PT2 are each formed in a wavy shape. The island portions IL are connected to the first portions PT1 and the second portions PT2, respectively. The insulating base 4 is flexible and can be formed of polyimide, for example, but not limited to this example.

The scanning lines 1 are disposed on the first portion PT1 of the insulating substrate 4 and are arranged in a wavy pattern. The signal lines 2 are disposed on the second portion PT2 of the insulating base 4 and are arranged in a wavy pattern. The scanning lines 1 and the signal lines 2 are examples of the wiring lines provided on the flexible substrate 100. The scanning lines 1 and the signal lines 2 can be formed, for example, of a metal material or a transparent conductive material, and may have a single-layer structure or a stacked multilayer structure. The flexible substrate 100 may comprise, in addition to the scanning lines 1 and the signal lines 2, other types of wiring lines, such as power lines that feed power to the electrical elements 3.

The scanning lines 1 each include a first portion 11 indicated by solid line and a second portion 12 indicated by dashed line. The second portion 12 overlaps the respective electrical element 3. The first portion 11 and the second portion 12 are located in layers different from each other and are electrically connected to each other via contact holes CH1 and CH2.

The scanning line 1 supplies scanning signals to the respective electrical element 3. When, for example, the electrical element 3 is a sensor which outputs a signal, an output signal from the electrical element 3 is supplied to the respective signal line 2. When, for example, the electrical element 3 is of a type which is activated in response to an input signal, such as a light-emitting element or an actuator, a drive signal is supplied to the signal line 2. A controller, including a supply source of scanning signals, a supply source of drive signals or a processor which processes output signals and the like, may be provided in the flexible board 100, or may be provided in a device connected to the flexible board 100.

The electrical element 3 is located on the respective island-shaped portion IL. The electrical element 3 is smaller than the island-shaped portion IL, and in FIG. 2, the island-shaped portion IL protrudes from an edge of the electrical element 3. For example, the electrical element 3 is a sensor, a semiconductor device, an actuator or the like. As the sensor, for example, an optical sensor which receives visible or near-infrared light, a temperature sensor, a pressure sensor, a touch sensor or the like can be applied. As the semiconductor element, for example, a light-emitting element, a light-receiving element, a diode, transistor or the like can be applied. When the electrical element 3 is a light-emitting element, a flexible display with flexibility and elasticity can be realized. As the light-emitting element, for example, a light-emitting diode or organic electroluminescent element, which has a size of around 10 μm, such as a mini-LED or micro-LED, can be applied. When the electrical element 3 is an actuator, a piezoelectric element can be applied. The electrical element 3 is not limited to those listed as examples here, but other elements with various functions can also be applied. Further, the electrical element 3 may be a capacitor, resistor or the like. The position and shape of the electrical element 3 are not limited to those of the example shown in FIG. 2.

In this embodiment, the first portion PT1 and the second portion PT2 of the insulating substrate 4, the scanning line 1, the signal line 2, a first organic insulating layer 5 and a second organic insulating layer 6, which will be described later, are collectively referred to as line portions LP, the island-shaped portion IL of the insulating substrate 4, an inorganic insulating layer 19, which will be described later, and the electrical element 3 are collectively referred to as island-shaped portions IP. The line portions LP and the island-shaped portions IP are located on the first shape memory resin layer 81. The line portions LP include a plurality of wave-shaped first line portions LP1 extending along the first direction D1 and arranged along the second direction D2 and a plurality of wave-shaped second line portions LP2 extending along the second direction D2 and arranged along the first direction D1, in plan view. At each of the intersections between the first line portions LP1 and the respective second line portions LP2, an island-shaped portion IP is located. The first line portions LP1 each include the first portion PT1 of the insulating substrate 4 described above, and the respective scanning line 1. The second line portions LP2 each include the second portion PT2 and the respective signal line 2. In each area enclosed by each pair of first line portions LP1 adjacent to each other and each respective pair of second line portions LP2 adjacent to each other, the insulating base 4 is not formed, but an opening OP is formed. In other words, the opening OP is an area enclosed by any two first portions PT1 adjacent to each other and respective two second portions PT2 adjacent to each other. The openings OP are arranged in a matrix along the first direction D1 and the second direction D2.

Figure 3:
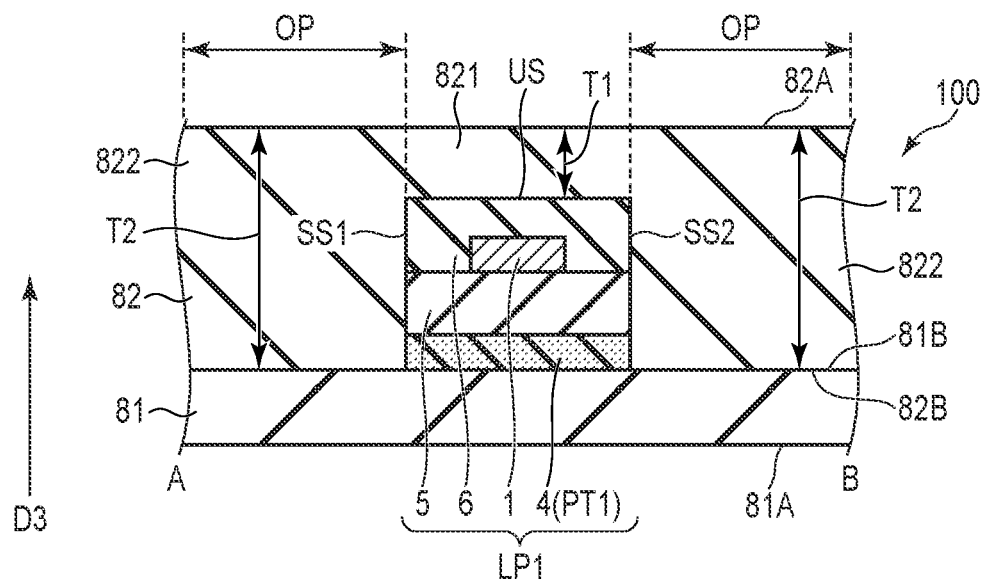
FIG. 3 is a partial cross-sectional view schematically showing the flexible substrate taken along line A-B in FIG. 2.

FIG. 3 is a partial schematic cross-sectional view of the flexible substrate 100 taken along line A-B in FIG. 2.

The flexible substrate 100 further comprises, in addition to the elements described above, a first organic insulating layer 5, a second organic insulating layer 6 and a second shape memory resin layer 82.

The first shape memory resin layer (first resin layer) 81 includes an outer surface 81A and an inner surface 81B on an opposite side to the outer surface 81A. The first line portion LP1 is located on the inner surface 81B. The first line portion LP1 includes a first side surface SS1, a second side surface SS2 on an opposite side to the first side surface SS1, and an upper surface US.

The first portion PT1 of the insulating base 4 is located on the inner surface 81B of the first shape memory resin layer 81. The first organic insulating layer 5 covers the insulating base 4. The scanning line 1 is located on the first organic insulating layer 5. The second organic insulating layer 6 covers the first organic insulating layer 5 and the scanning line 1. The first organic insulating layer 5 and the second organic insulating layer 6 are each formed of an organic material.

The second shape memory resin layer (second resin layer) 82 includes an outer surface 82A and an inner surface 82B on an opposite side to the outer surface 82A. The second shape memory resin layer 82 covers the first side surface SS1, the second side surface SS2 and the upper surface US of the first line portions LP1. In other words, the second shape memory resin layer 82 covers the scanning line 1, the insulating substrate 4, the first organic insulating layer 5, and the second organic insulating layer 6. The second shape memory resin layer 82 is in contact with the insulating base 4, the first organic insulating layer 5 and the second organic insulating layer 6 of the first line portion LP1. Further, the inner surface 82B of the second shape memory resin layer 82 is in contact with the inner surface 81B of the first shape memory resin layer 81 in the respective opening OP. The first shape memory resin layer 81, the insulating base 4, the scanning line 1 and the second shape memory resin layer 82 overlap each other along the third direction D3. The insulating base 4 and the scanning line 1 are located between the first shape memory resin layer 81 and the second shape memory resin layer 82.

Here, of the second shape memory resin layer 82, portion where a plurality of first portions PT1 and second portions PT2 and a plurality of island-shaped portions IL overlap each other is referred to as a first portion 821, and a portion located between each of the first portions PT1 and the respective one of second portions PT2, that is, the portion overlapping the respective opening OP is referred to as a second portion 822. The second portion 822 is in contact with the first shape memory resin layer 81.

The first shape memory resin layer 81 and the second shape memory resin layer 82 are each formed of a shape memory resin. The shape memory resin may as well be referred to as a smart polymer, for example. Smart polymers are polymers whose properties change in response to external environmental changes such as of temperature, magnetic force, light and the like. The first shape memory resin layer 81 and the second shape memory resin layer 82 in this embodiment are each formed using a smart polymer that deforms when externally stimulated by temperature, magnetic force, light and the like.

The first shape memory resin layer 81 and the second shape memory resin layer 82 have adhesiveness, and the outer surface 81A or the outer surface 82A can be attached to an object. Note that the flexible substrate 100 may include an adhesive layer formed on the outer surface 81A or the outer surface 82A.

Figure 4:
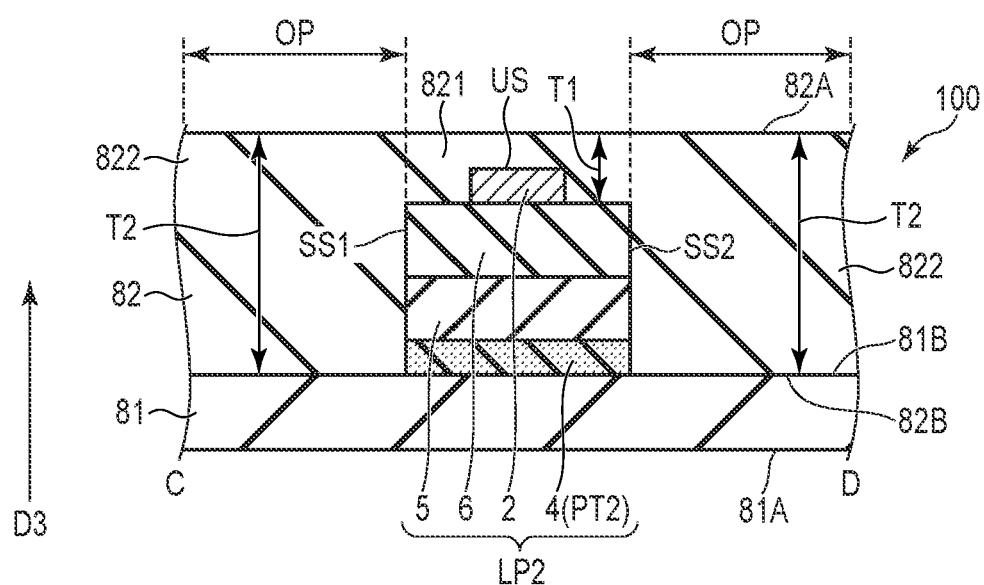
FIG. 4 is a partial cross-sectional view schematically showing the flexible substrate taken along line C-D in FIG. 2.

FIG. 4 is a partially schematic cross-sectional view of the flexible substrate 100 taken along line C-D in FIG. 2.

The second line portion LP2 is located on the inner surface 81B of the first shape memory resin layer 81. The second line portion LP2 includes a first side surface SS1, a second side surface SS2 on an opposite side to the first side surface SS1 and an upper surface US.

The second portion PT2 of the insulating base 4 is located on the inner surface 81B of the first shape memory resin layer 81. The first organic insulating layer 5 covers the insulating base 4. The second organic insulating layer 6 covers the first organic insulating layer 5. The signal line 2 is located on the second organic insulating layer 6. The second shape memory resin layer 82 covers the first side surface SS1, the second side surface SS2 and the upper surface US of the second line portion LP2, and is in contact with the inner surface 81B of the first shape memory resin layer 81 in the opening OP. That is, the second shape memory resin layer 82 covers the insulating substrate 4, the first organic insulating layer 5, the second organic insulating layer 6 and the signal line 2, and is in contact with each thereof. The first shape memory resin layer 81, the insulating base 4, the signal line 2 and the second shape memory resin layer 82 overlap each other along the third direction D3. The insulating base 4 and the signal line 2 are located between the first shape memory resin layer 81 and the second shape memory resin layer 82.

In the examples shown in FIGS. 3 and 4, the first line portion LP1 and the second line portion LP2 are covered by the first shape memory resin layer 81 and the second shape memory resin layer 82. But such a configuration may as well do that a flexible resin is used in place of the first shape memory resin layer 81, and a shape memory resin is used for the second shape memory resin layer 82, or a shape memory resin is used for the first shape memory resin layer 81, and a flexible resin is used in place of the second shape memory resin layer 82.

Further, in this embodiment, the resin layer below the first line portions LP1 and the second line portions LP2 is referred to as a first resin layer, and the resin layer above the first line portion LP1 and the second line portion LP2 is referred to as a second resin layer. In the above-described embodiment, the first resin layer (the first shape memory resin layer 81) is a shape memory resin layer, and the first portion 821 and the second portion 822 of the second resin layer (the second shape memory resin layer 82) as well are each a shape memory resin layer. That is, the first portion 821 is made of the same material as that of the second portion 822. The first portion 821 and the second portion 822 are a shape memory resin layers formed integrated as one body. Further, a thickness T1 of the first portion 821 is less than a thickness T2 of the second portion 822.

Figure 5:
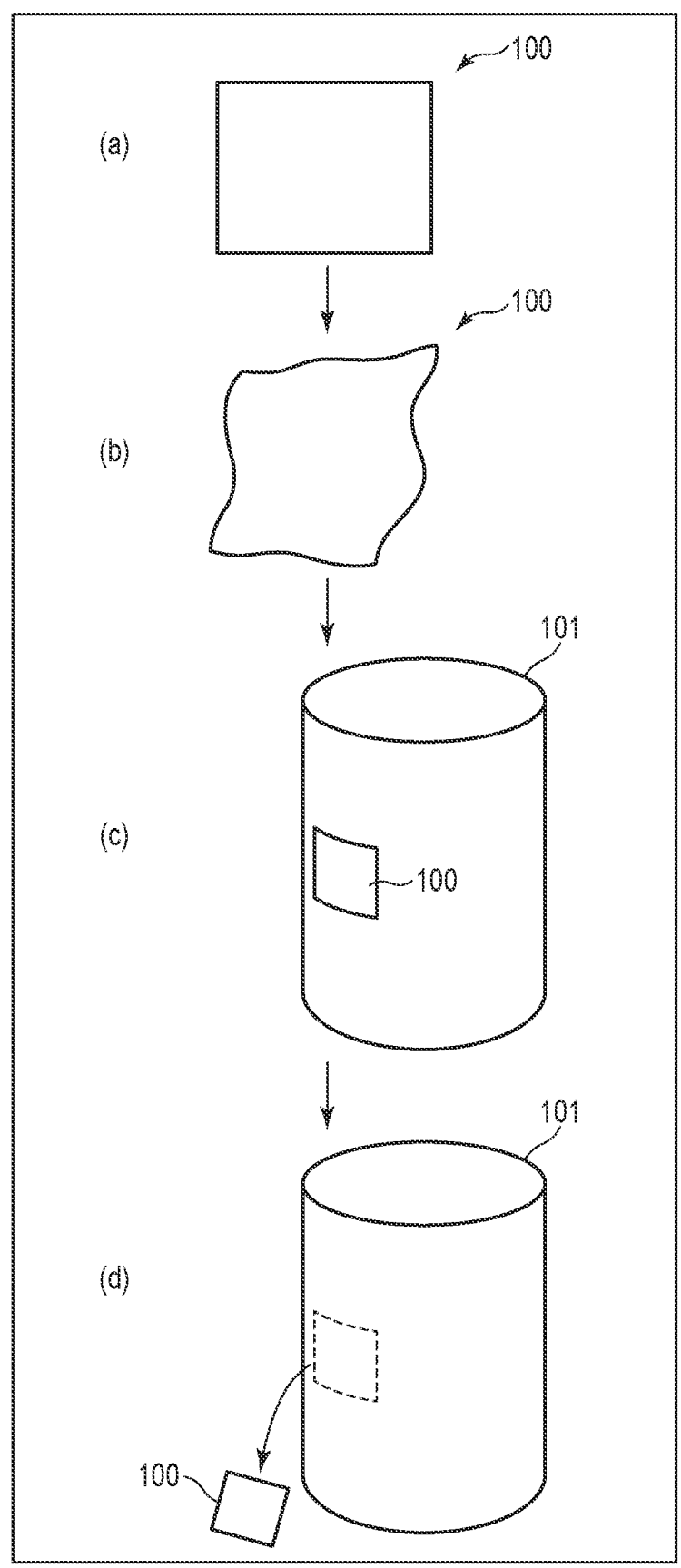
FIG. 5 is a diagram showing attachment and detachment of a flexible substrate to and from an object.

FIG. 5 is a diagram illustrating attachment and detachment of the flexible substrate 100 to and from an object 101.

First, as shown in FIG. 5, part (a), the flexible substrate 100 has a basic shape of, for example, a flat rectangular shape. At this time, the temperature of the shape memory resin layer is a temperature A, and the shape memory resin layer is stable in terms of energy at the temperature A. In other words, the shape memory resin layer is set to cure at the temperature A.

As shown in FIG. 5, part (b), at a temperature B, the shape memory resin layer softens and the flexible substrate 100 can be deformed. At this time, the temperature B is higher than the temperature A. At the temperature B, the flexible substrate 100 is deformed into a desired shape. Here, since the shape memory resin layer is unstable in terms of energy, a force to restore the basic shape shown in FIG. 5, part (a) is created in the flexible substrate 100.

As shown in FIG. 5, part (c), the flexible substrate 100 is deformed in the state at the temperature B, and is attached to the object 101. The flexible substrate 100 is deformed into a shape that follows the shape of the object 101. In the example illustrated, the flexible substrate 100 is attached to a curved surface of the object 101, and therefore deformed into a shape which follows the curved surface of the object 101. After the flexible substrate 100 is attached to the object 101, when the temperature of the shape memory resin layer decreases to the temperature A, the shape memory resin layer cures and the deformed state of the flexible substrate 100 is maintained.

As shown in FIG. 5, part (d), when the temperature of the object 101 rises and reaches the temperature B, the shape memory resin layer softens and restores the basic shape which is stable in terms of energy. The amount of deformation of the shape memory resin layer is adjusted, for example, by the glass transition temperature and the cross-linking reaction between polymers.

According to this embodiment, the flexible substrate 100 comprises a shape memory resin layer. Therefore, the flexible substrate 100 can be deformed at a specific temperature or higher, and the flexible substrate 100 can be cured in a deformed state at a specific temperature or lower. Further, the basic shape of the flexible substrate 100 can be recovered from the deformed state at a specific temperature or higher. Therefore, when the temperature of the object 101 increases to a specific temperature or higher as described above, the flexible substrate 100 can be peeled off from the object 101 to prevent the flexible substrate 100 from being overheated. That is, it is possible to suppress functional damage caused by overheating of the flexible substrate 100.

Further, the flexible substrate 100 can be repeatedly attached to and detached from the object 101. After the flexible substrate 100 is peeled off from the object 101, it can be attached by deforming it again.

In the example shown in the figure, the shape memory resin layer is deformed by temperature, but the flexible substrate 100 may comprise a shape memory resin layer which is deformed by magnetic force, light or the like.

Figure 6:
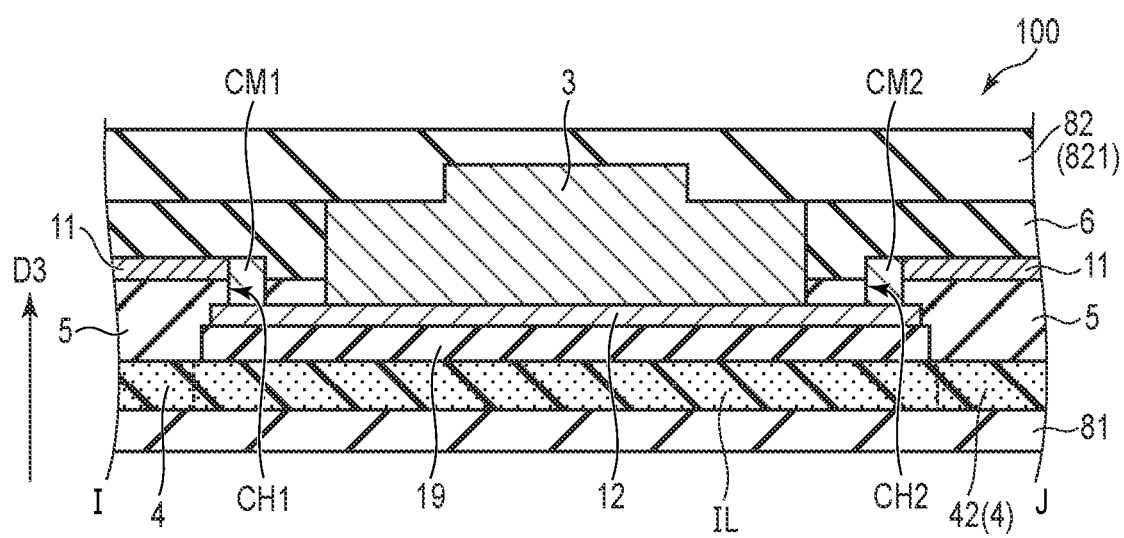
FIG. 6 is a partial cross-sectional view schematically showing the flexible substrate taken along line I-J in FIG. 2.

FIG. 6 is a partial schematic cross-sectional view of the flexible substrate 100 taken along I-J in FIG. 2.

The electrical element 3 is disposed on the island-shaped portion IL of the insulating base 4. An inorganic insulating layer 19 (a passivation layer) is disposed between the electrical element 3 and the island-shaped portion IL. The inorganic insulating layer 19 is formed into an island shape superimposed on the electrical element 3 (or the island-shaped portion IL) in plan view. The first portion 11 is disposed on the first organic insulating layer 5 and covered by the second organic insulating layer 6. The second portion 12 is disposed on the inorganic insulating layer 19 and is electrically connected to the electrical element 3. In the example shown in FIG. 6, both ends of the second portion 12 are covered by the first organic insulating layer 5.

The contact holes CH1 and CH2 are provided in the first organic insulating layer 5. The first portion 11 is electrically connected to the second portion 12 via connection members CM1 and CM2 disposed in the contact holes CH1 and CH2, respectively. The connection members CM1 and CM2 may be a part of the first portion 11 or may be provided separately from the first portion 11.

Thus, between the electrical element 3 and the insulating substrate 4, an island-shaped inorganic insulating layer 19 is disposed. This inorganic insulating layer 19 functions as a protective film which inhibits the entering of moisture and the like into the electrical element 3 and the second portion 12 of the scanning line 1. Thus, the reliability of the flexible substrate 100 is improved. Further, generally, inorganic films are more susceptible to cracking as compared to organic films; however the inorganic insulating layer 19 is not provided below the first portion 11 of the scanning line 1, and therefore disconnection at the first portion 11 can be suppressed. This is also the case for the signal lines, which are not shown in the figure. Moreover, compared to the case where the inorganic insulating layer 19 is provided over the entire flexible substrate 100, the elasticity and flexibility of the flexible substrate 100 are less likely to be degraded.

Further, in the scanning line 1, the second portion 12 overlapping the electrical element 3 is placed in a layer different from the first portion 11, the degree of freedom of design in the vicinity of the electrical element 3 can be improved. In addition, since the contact holes CH1 and CH2 are located above the inorganic insulating layer 19, connection errors which may occur in the connection position between the first portion 11 and the second portion 12 can be suppressed. Furthermore, the island-shaped portion IL of the insulating base 4 is located below the electrical element 3. With this structure, the electrical element 3 can be excellently supported.

The island-shaped portion IL is located on the inner surface 81B of the first shape memory resin layer 81. The second shape memory resin layer 82 covers the electrical element 3. The first shape memory resin layer 81, the island-shaped portion IL, the electrical element 3, and the second shape memory resin layer 82 overlap each other along the third direction D3.

Figure 7:
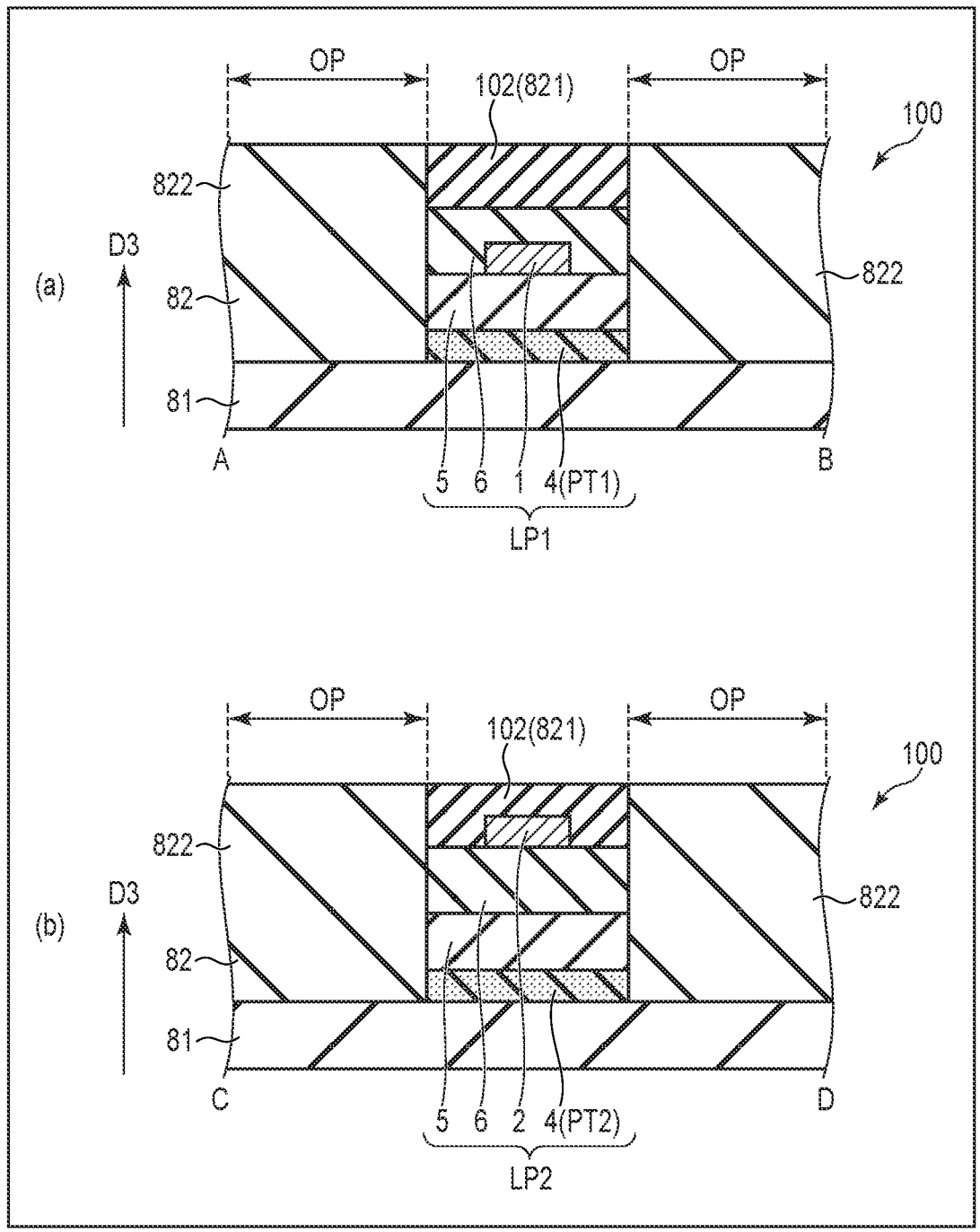
FIG. 7 is a diagram showing a first modified example of the flexible substrate.

FIG. 7 is a diagram showing a first modified example of the flexible substrate 100. As compared to the configuration shown in FIGS. 3 and 4, the configuration shown in FIG. 7 is different in that a flexible resin portion 102 is formed in the same layer as that of the second shape memory resin layer 82. FIG. 7, part (a) is a partial schematic cross-section of the flexible substrate 100 taken along line A-B in FIG. 2. FIG. 7, part (b) is a partial schematic cross-section of the flexible substrate 100 taken along line C-D in FIG. 2.

The second shape memory resin layer 82 overlaps the first shape memory resin layer 81 in the opening OP. The flexible resin section 102 overlaps the first shape memory resin layer 81 along the third direction D3. In the example shown in FIG. 7, part (a), the stretched resin portion 102 overlaps the first portion PT1 of the insulating base 4 and scanning line 1, and is in contact with the second organic insulating layer 6 and the second shape memory resin layer 82. In the example shown in FIG. 7, part (b), the stretched resin portion 102 overlaps the second portion PT2 of the insulating substrate 4 and the signal line 2, and is in contact with the second organic insulating layer 6, the second shape memory resin layer 82 and the signal line 2. The flexible resin portion 102 is formed, for example, of a flexible organic material. Further, since the flexible resin portion 102 is located on the same layer as that of the second shape memory resin layer 82, it does not overlap the second shape memory resin layer 82 along the third direction D3.

Thus, the first shape memory resin layer 81 and the second shape memory resin layer 82 are formed over substantially the entire flexible substrate 100, and the flexible resin section 102 may be formed in a part of the same layer as those of the first shape memory resin layer 81 and the second shape memory resin layer 82. In the example illustrated, the flexible resin portion 102 is located in the same layer as that of the second shape memory resin layer 82, but the flexible resin portion 102 may be formed in the same layer as that of the first shape memory resin layer 81, or may be formed in the same layer as those of both the first shape memory resin layer 81 and the second shape memory resin layer 82.

In the first modified example above, the first resin layer (the first shape memory resin layer 81) is a shape memory resin layer, the first portion 821 of the second resin layer is a flexible resin layer, and the second portion 822 is a shape memory resin layer. That is, the first portion 821 is formed of a material different from that of the second portion 822.

Figure 8:
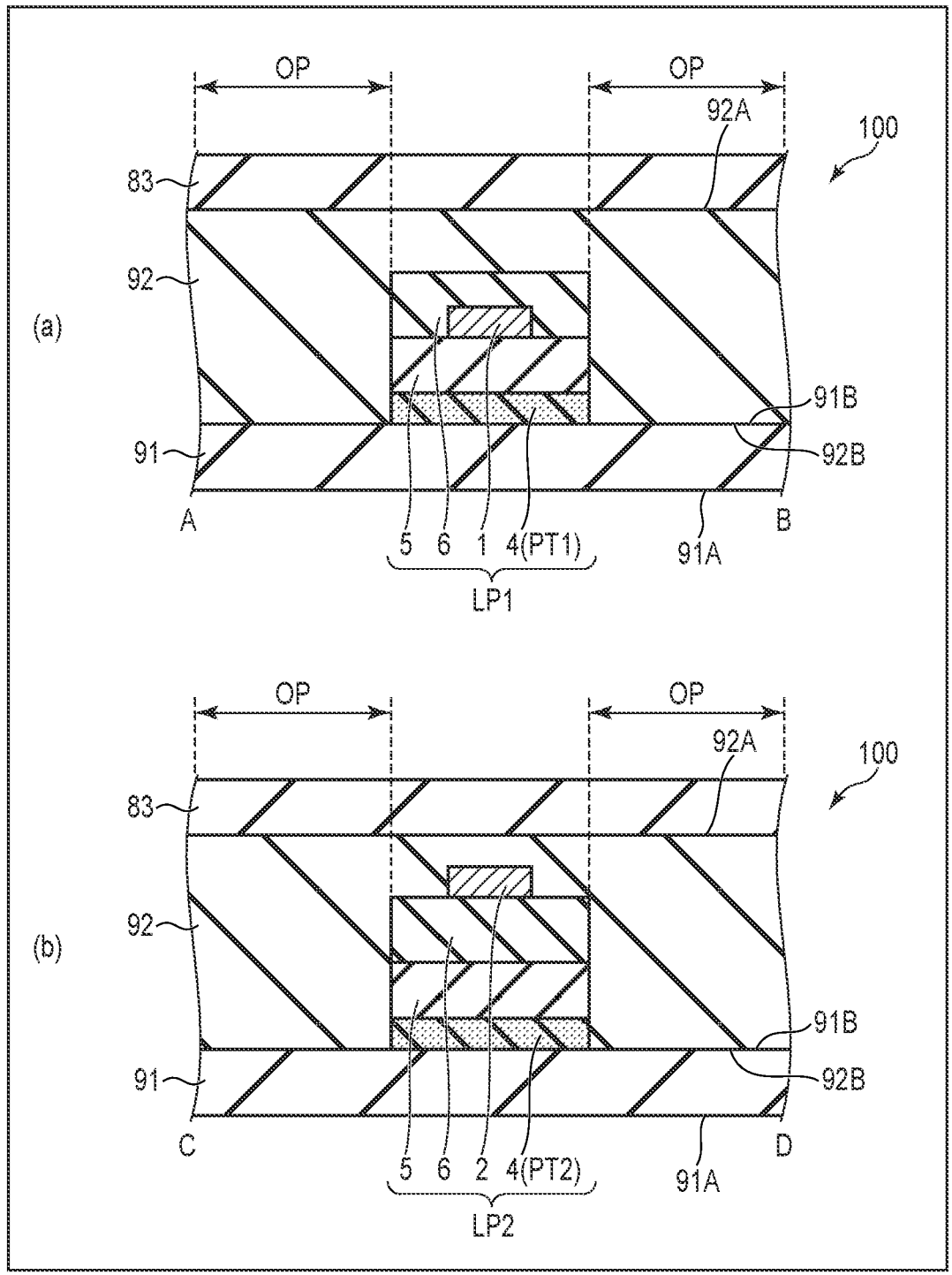
FIG. 8 is a diagram showing a second modified example of the flexible substrate.

FIG. 8 is a diagram showing a second modified example of the flexible substrate 100. The configuration shown in FIG. 8 is different from that of FIGS. 3 and 4 in that the first line portion LP1 and the second line portion LP2 are surrounded by the first flexible resin layer 91 and the second flexible resin layer 92. FIG. 8, part (a), is a partial schematic cross-section of the flexible substrate 100 taken along line A-B in FIG. 2. FIG. 8, part (b), is a partial schematic cross-section of the flexible substrate 100 taken along line C-D in FIG. 2.

The flexible substrate 100 comprises a first flexible resin layer 91 and a second flexible resin layer 92. The first expansion resin layer 91 is formed at the position of the first shape memory resin layer 81 shown in FIGS. 3 and 4. The first elastic resin layer 91 includes an outer surface 91A and an inner surface 91B on an opposite side to the outer surface 91A. The first elastic resin layer 91 is formed using a material different from that of the first shape memory resin layer 81. The first flexible resin layer 91 may be formed by applying an organic material to the lower surfaces of the insulating base 4 and the second flexible resin layer 92, or it may be attached via an adhesive layer formed as a film or plate.

The second flexible resin layer 92 is formed at the portion of the second shape memory resin layer 82 shown in FIGS. 3 and 4. The second flexible resin layer 92 includes an inner surface 92B opposing the inner surface 91B and an outer surface 92A on an opposite side to the inner surface 92B. The inner surface 92B of the second elastic resin layer 92 is in contact with the inner surface 91B of the first elastic resin layer 91. The second flexible resin layer 92 is formed using a material different from that of the second shape memory resin layer 82. The second flexible resin layer 92 is formed of a poly-p-xylylene (PPX) structure, such as Parylene (registered trademark).

The insulating base 4 is located between the first flexible resin layer 91 and the second flexible resin layer 92. A third shape memory resin layer 83 is located on the outer surface 92A. The third shape memory resin layer 83 is located on the outer surface 92A of the second elastic resin layer 92. The third shape memory resin layer 83 overlaps the opening OP, the first portion PT1, the second portion PT2, the scanning line 1 and the signal line 2.

Figure 9:
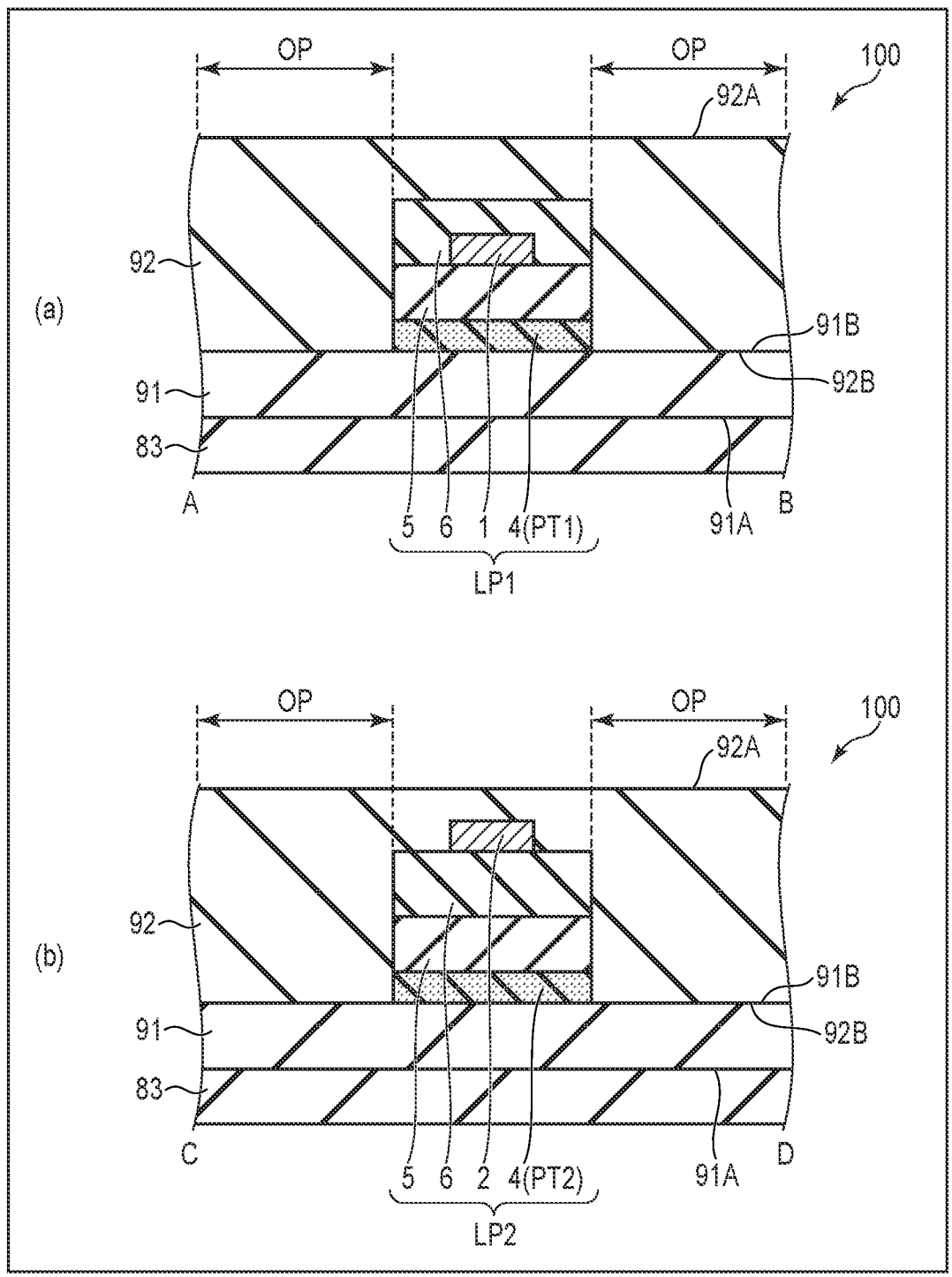
FIG. 9 is a diagram showing a third modified example of the flexible substrate.

FIG. 9 is a diagram showing a third modified example of the flexible substrate 100. The configuration shown in FIG. 9 is different from that of FIG. 8 in that the third shape memory resin layer 83 is formed on the outer surface 91A of the first flexible resin layer 91. FIG. 9, part (a) is a partial schematic cross-sectional view of the flexible substrate 100 taken along line A-B in FIG. 2. FIG. 9, part (b) is a partial schematic cross-sectional view of the flexible substrate 100 taken along line C-D in FIG. 2.

The third shape memory resin layer 83 overlaps the opening OP, the first portion PT1, the second portion PT2, the scanning line 1 and the signal line 2.

As shown in FIGS. 8 and 9, the third shape memory resin layer 83 may be formed on either one or both of the outer surface 91A of the first flexible resin layer 91 and the outer surface 92A of the second flexible resin layer 92.

Figure 10:
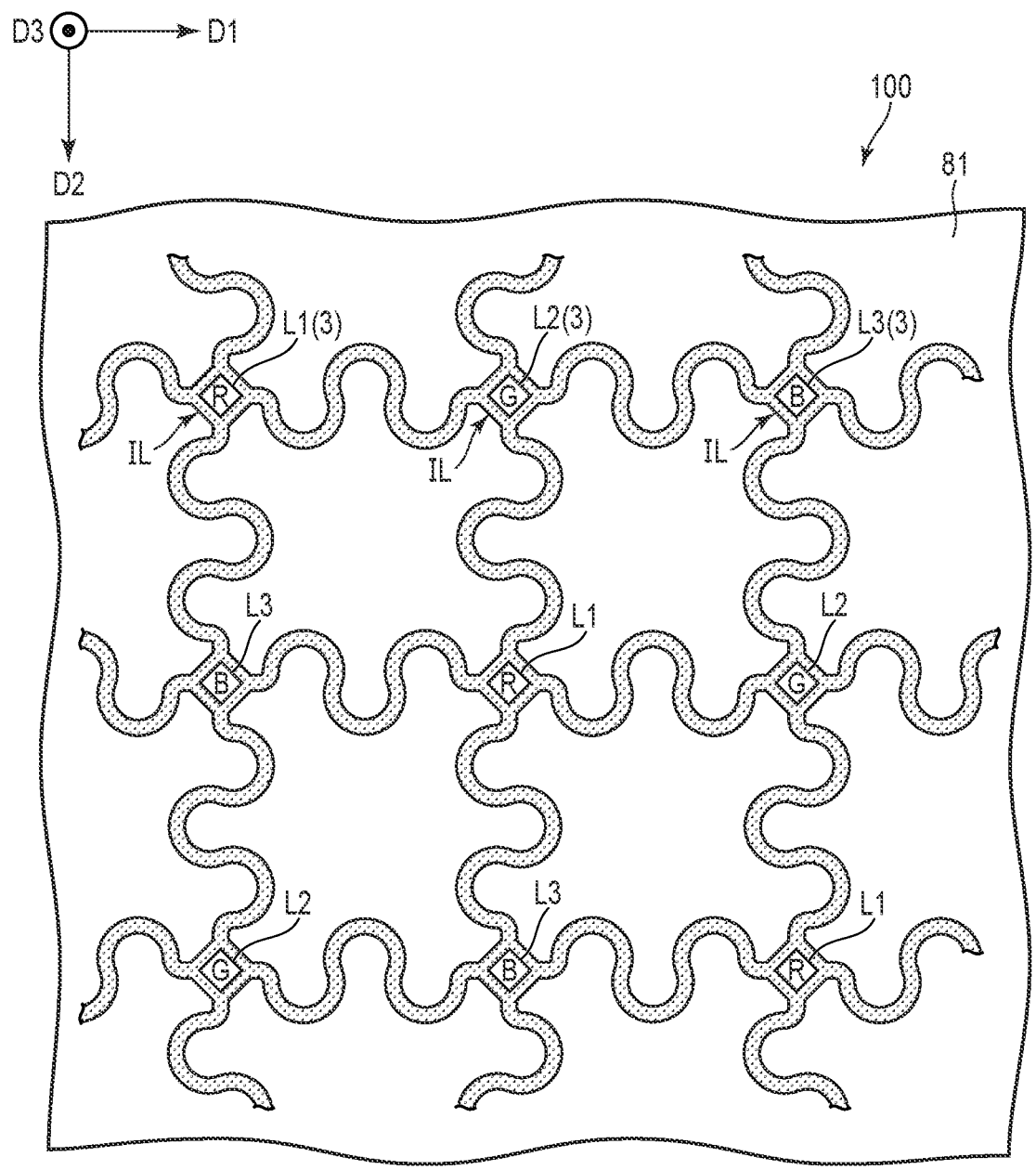
FIG. 10 is a diagram showing a fourth modified example of the flexible substrate.

FIG. 10 is a diagram showing a fourth modified example of the flexible substrate 100. FIG. 10 shows the case where the electrical elements 3 shown in FIG. 2 are light-emitting elements L1, L2 and L3, respectively.

The flexible substrate 100 comprises a red (R) light-emitting element L1, a green (G) light-emitting element L2 and a blue (B) light-emitting element L3. On each of the island-shaped portions IL, any one of the light-emitting elements L1, L2 and L3 is disposed. The light-emitting elements L1, L2 and L3 are mini-LEDs or micro-LEDs having a size of around 100 µm. In this way, the flexible substrate 100 includes light-emitting elements L1, L2 and L3, and with this structure, a flexible display having flexibility and elasticity can be realized.

Figure 11:
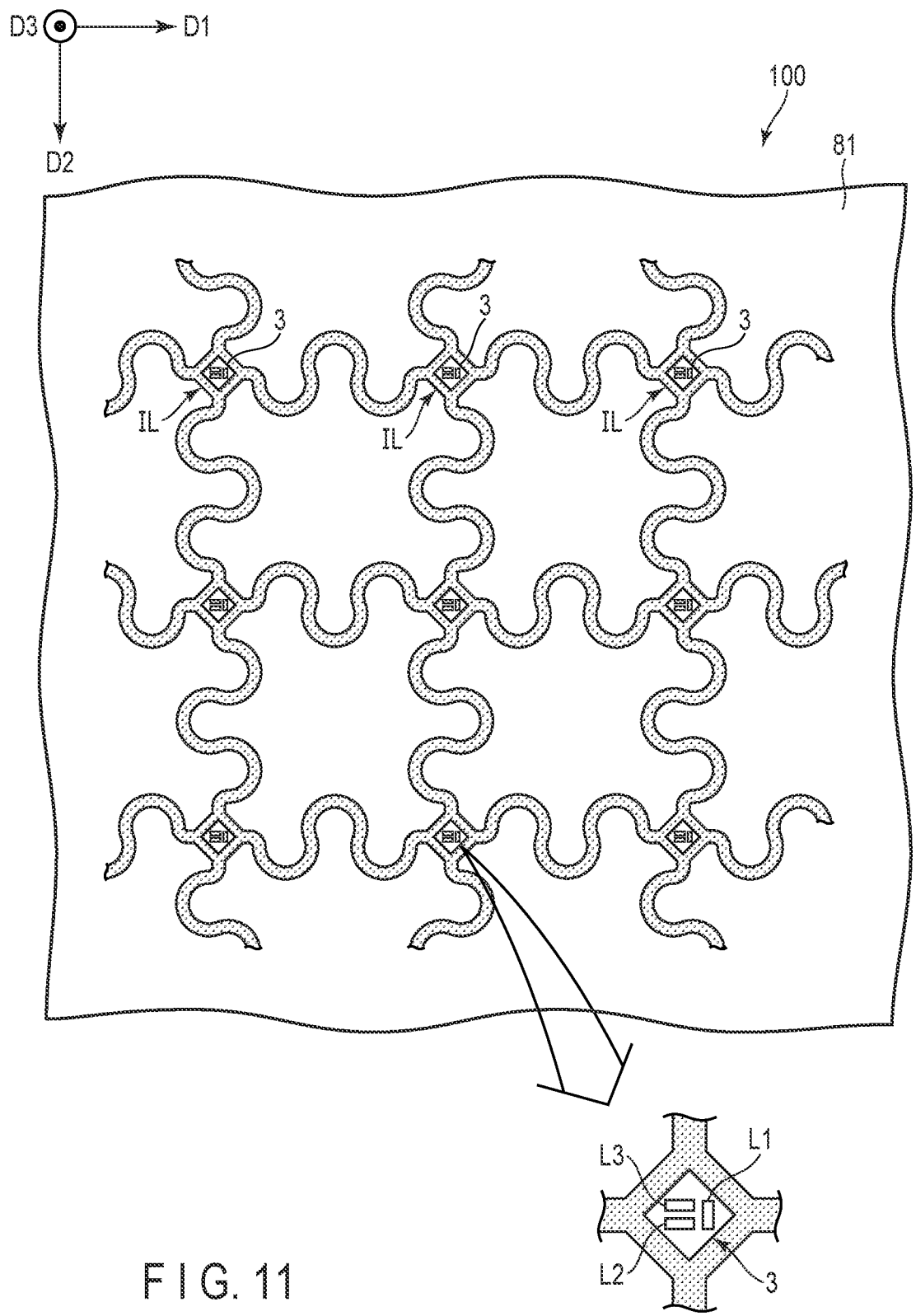
FIG. 11 is a diagram showing a fifth modified example of the flexible substrate.

FIG. 11 is a diagram showing a fifth modified example of the flexible substrate 100. The configuration shown in FIG. 11 is different from that of FIG. 10 in that three light-emitting elements L1, L2 and L3 are disposed in one island-shaped portion IL.

The light-emitting elements L1, L2 and L3 are, for example, any of red, green and blue light-emitting elements. Or, the light-emitting elements L1, L2 and L3 may be light-emitting elements of the same color as each other. In the example illustrated, three light-emitting elements L1, L2 and L3 are disposed in one island-shaped portion IL, but such a configuration is not limited to that of this example, but two light-emitting elements may be disposed in one island-shaped portion IL, or four or more light-emitting elements may be disposed in one island-shaped portion IL. Further, the arrangement and direction of the light-emitting elements L1, L2 and L3 are not limited to those of the examples shown in the figures.

As explained above, according to this embodiment, an electronic device comprising a shape memory resin layer can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
a plurality of scanning lines extending along a first direction;
a plurality of signal lines extending along a second direction intersecting the first direction;
a plurality of electrical elements each being located at an intersection of each of the scanning lines and each of the signal lines, and being electrically connected to each of the scanning lines and each of the signal lines;
a first shape memory resin layer;
a flexible insulating base disposed on the first shape memory resin layer;
a wiring line disposed on the insulating base; and
a second shape memory resin layer covering the insulating base and the wiring line,
wherein
the plurality of the scanning lines and the plurality of the signal lines have wavy shape,
the insulating base and the wiring line are located between the first shape memory resin layer and the second shape memory resin layer,
the insulating base includes a plurality of line portions in which the wiring line is located, and a plurality of island-shaped portions connected to the plurality of line portions,
the second shape memory resin layer includes a first portion overlapping the plurality of line portions and the plurality of island-shaped portions, and a second portion located between the plurality of line portions,
the second portion is in contact with the first shape memory resin layer, and
the first portion and the second portion are formed of a same material to be integrated into one body, and the plurality of the scanning lines and the plurality of the signal lines include the wiring line.

2. The electronic device according to claim 1, wherein a thickness of the first portion is less than a thickness of the second portion.

3. An electronic device comprising:
a plurality of scanning lines extending along a first direction;
a plurality of signal lines extending along a second direction intersecting the first direction;
a plurality of electrical elements each being located at an intersection of each of the scanning lines and each of the signal lines, and being electrically connected to each of the scanning lines and each of the signal lines;
a first shape memory resin layer;
a second shape memory resin layer;
an insulating base located between the first shape memory resin layer and the second shape memory resin layer;
a flexible resin section overlapping the first shape memory resin layer; and
a wiring line located between the insulating base and the flexible resin section,
wherein
the plurality of the scanning lines and the plurality of the signal lines have wavy shape,
the insulating base includes a plurality of line portions in which the wiring line is located, and a plurality of island-shaped portions connected to the plurality of line portions,
the flexible resin section overlaps the plurality of line portions and the plurality of island-shaped portions,
the second shape memory resin layer is located between the plurality of line portions,
the flexible resin section is formed of a material different from that of the second shape memory resin layer,
the second shape memory resin layer is in contact with the first shape memory resin layer, and
the plurality of the scanning lines and the plurality of the signal lines include the wiring line.

4. The electronic device according to claim 3, wherein the flexible resin section is formed in a same layer as that of the second shape memory resin layer.

* * * * *